United States Patent
Cho et al.

(10) Patent No.: US 9,312,004 B1
(45) Date of Patent: Apr. 12, 2016

(54) DRIVER FOR SEMICONDUCTOR MEMORY AND SYSTEM INCLUDING THE SAME

(71) Applicants: SK hynix Inc., Icheon (KR); KOREA ADVANCED INSTITUTE OF SCIENCE AND TECHNOLOGY, Daejeon (KR)

(72) Inventors: Gyu Hyeong Cho, Daejeon (KR); Suk Hwan Choi, Daejeon (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 14/746,394

(22) Filed: Jun. 22, 2015

(30) Foreign Application Priority Data

Nov. 21, 2014 (KR) .......................... 10-2014-0163614

(51) Int. Cl.
 *G11C 13/00* (2006.01)
 *G11C 7/12* (2006.01)

(52) U.S. Cl.
 CPC .............. *G11C 13/0069* (2013.01); *G11C 7/12* (2013.01)

(58) Field of Classification Search
 CPC .................................. G11C 13/0069; G11C 7/12
 See application file for complete search history.

(56) References Cited

U.S. PATENT DOCUMENTS

| | | | | |
|---|---|---|---|---|
| 5,689,460 A * | 11/1997 | Ooishi | ................... | G11C 5/143 327/530 |
| 6,809,573 B2 * | 10/2004 | Kim | ...................... | H02M 3/073 327/536 |
| 7,948,793 B2 | 5/2011 | Porter et al. | | |
| 8,467,238 B2 | 6/2013 | Wu | | |
| 2012/0170360 A1 * | 7/2012 | Yoon | ......................... | G11C 7/04 365/163 |
| 2012/0195113 A1 * | 8/2012 | Yoon | ................... | G11C 13/0004 365/163 |
| 2013/0308396 A1 * | 11/2013 | Cho | ........................ | G11C 5/147 365/189.09 |
| 2014/0169089 A1 * | 6/2014 | Castro | ...................... | G11C 7/10 365/163 |

FOREIGN PATENT DOCUMENTS

KR  10-2009-0006634 A  1/2009

* cited by examiner

*Primary Examiner* — Khamdan Alrobaie

(57) ABSTRACT

A driver for a semiconductor memory may reduce an error in writing data in memory cells by adjusting the height and width of a spike current, when the memory cells in which data having the same level are written are arranged at different distances. In addition, the driver may reduce the error by controlling the amount of charges supplied to each of the memory cells that are arranged at different distances.

20 Claims, 12 Drawing Sheets

Prior Art

DRIVER FOR SEMICONDUCTOR MEMORY AND SYSTEM INCLUDING THE SAME

CROSS-REFERENCE TO RELATED APPLICATION

The present application claims priority of Korean Patent Application No. 10-2014-0163614, filed on Nov. 21, 2014, which is incorporated herein by reference in its entirety.

BACKGROUND

1. Field

Embodiments of the present disclosure relate to a driver for a semiconductor memory such as a PRAM or ReRAM and a system including the same, and more particularly, to a driver for a semiconductor memory, which is capable of increasing a write speed by momentarily charging each memory cell with parasitic capacitance, and a system including the same.

2. Description of the Related Art

As the development of information and communication technology is accelerated, a device capable of using texts, voices, and images together and performing interactive communication has become more desirable. Such a device may include a semiconductor element capable of processing more information at a high speed. In order to improve the performance of a system that includes such a device, a memory element which is a core part of the system is desirable to increase in speed and integration degree and to reduce in power consumption. A conventional DRAM may include a cell that has a 1-Transistor/1-Capacitor structure. As the size of the cell shrinks, a process of fabricating a capacitor of the cell becomes more difficult, and thus a nonvolatile memory capable of replacing the conventional DRAM becomes more desirable.

Next-generation memories which are currently developed aim at realizing the high integration and low power consumption of DRAM, the non-volatility of flash memory, and a high-speed operation of SRAM. Representative examples of the next generation memories include PRAM (phase change RAM), NFGM (nano floating gate memory), ReRAM (resistance RAM), PoRAM (polymer RAM), and MRAM (magnetic RAM). Since those memories have parasitic capacitance existing in a cell and a wiring coupled to the cell, a write delay may occur due to the parasitic capacitance, and thus a write speed may be reduced.

According to a conventional current driving method for addressing the above issues, a charging current is momentarily fed back to pre-charge parasitic capacitance, thereby reducing a data driving time and increasing the write speed.

FIG. 1 is a circuit diagram of a semiconductor integrated circuit, which corresponds to FIG. 17 of US Patent Laid-open Publication No. 2010/0118591. The semiconductor integrated circuit includes a boost circuit 70 to supply a write current to a memory cell, in addition to a constant current source circuit 20. The semiconductor integrated circuit controls the magnitude of a spike current supplied from the boost circuit 70 according to a distance from the constant current source circuit 20 to a write target memory cell group. As the distance from the constant current source circuit 20 to the write target memory cell group increases, the spike current supplied from the boost circuit 70 is set to have a larger value.

SUMMARY

Various embodiments of the present disclosure are directed to a driver for a semiconductor memory, which is capable of reducing an error in writing data by adjusting height and width of a spike current supplied to a memory cell, when memory cells in which data having the same level are written are arranged at different distances, and a system including the same.

Also, various embodiments are directed to a driver for a semiconductor memory, which is capable of reducing an error of writing data by controlling the amount of charges supplied to each memory cell within a predetermined range while adjusting the height and width of a spike current, when memory cells in which data having the same level are written are arranged at different distances, and a system including the same.

In an embodiment, a driver for a semiconductor memory may include: a momentarily dropping voltage generation unit configured to generate a momentarily dropping voltage using data for adjusting the height of an overdrive current to be written to each cell within a memory cell array of a predetermined area and data for adjusting the width of the overdrive current; a D/A conversion unit configured to output a spike current including the overdrive current using the momentarily dropping voltage; a cell voltage detection unit configured to compare a charging voltage based on a spike current applied to each cell within a test cell array to a predetermined reference voltage, and outputting a signal for the comparison result; a calibration control unit configured to calibrate the height and width of the overdrive current using the signal outputted from the cell voltage detection unit; and a calibration table storage unit configured to store the data for adjusting the height of the overdrive current for each cell and the data for adjusting the width of the overdrive current, which are outputted from the calibration control unit. The test cell array may be arranged to correspond to the memory cell array.

The momentarily dropping voltage generation unit may include: a D/A converter configured to convert the height adjusting data outputted from the calibration table storage unit into a height adjusting signal having an analog value; a short pulse generator configured to generate a short pulse signal using the width adjusting data outputted from the calibration table storage unit; a height adjusting capacitor configured to be charged with a voltage for adjusting the height of the overdrive current using the height adjusting signal; and a dropping voltage transmission switch configured to switch in response to the short pulse signal and transmit the height adjusting voltage.

The height of an overdrive current flowing into a cell arranged at a first position within the memory cell array may be smaller than the height of an overdrive current flowing into a cell arranged at a second position within the memory cell array, the width of the overdrive current flowing into the cell arranged at the first position within the memory cell array may be larger than the width of the overdrive current flowing into the cell arranged at the second position within the memory cell array, and a distance between the cell arranged at the first position and the current D/A conversion unit may be smaller than a distance between the cell arranged at the second position and the current D/A conversion unit.

The amount of charge generated by the overdrive current flowing into the cell arranged at the first position may be substantially equal to the amount of charge generated by the overdrive current flowing into the cell arranged at the second position.

The height adjusting voltage stored in the height adjusting capacitor may be controlled to adjust the height of the overdrive current.

A turn-on time of the short pulse signal outputted from the short pulse generator may be controlled to adjust the width of the overdrive current.

The calibration controller performs a search algorithm and, when, in the search algorithm, a search point has shifted in a direction to maintain or reduce the width of the overdrive current and, the calibration controller controls the search point to move in the direction when the search point does not cross the overdrive current curve during the shift.

The calibration controller performs a search algorithm and, when, in the search algorithm, a search point moves in a first direction to maintain or reduce the width of the overdrive current and, the calibration controller controls the search point to move in a second direction to reduce the width of the overdrive current when the search point does not cross the overdrive current curve during the shift.

The cell voltage detection unit may include: a cell current detector configured to detect a cell current flowing through each cell within the test cell array, and output a cell voltage corresponding to the cell current; first and second voltage samplers configured to sample the stabilized cell voltage and store the sampled voltage in first and second capacitors, respectively; first and second amplifiers configured to amplify the cell voltages outputted from the first and second voltage samplers into first and second reference voltages, respectively; and first and second comparators configured to compare the initial cell voltage which is not yet stabilized to the first and second reference voltages, respectively.

In another embodiment, a system may include: a memory comprising a driver; an I/O interface used by a user to generate information; a wireless interface used to exchange information with a wireless communication network; and a CPU configured to control the memory, the I/O interface, and the wireless interface. The driver may include: a momentarily dropping voltage generation circuit configured to generate a momentarily dropping voltage using first data for adjusting a height of an overdrive current that flows into a cell of a memory cell array and second data for adjusting a width of the overdrive current; a digital/analog (D/A) conversion circuit configured to output a first spike current that includes the overdrive current using the momentarily dropping voltage; a cell voltage detection circuit configured to compare a cell voltage to a predetermined reference voltage, and to output a comparison signal representing the comparison result, the cell voltage being generated based on a second spike current that flows into a cell of a test cell array; a calibration controller configured to calibrate the height and width of the overdrive current using the comparison signal output from the cell voltage detection unit; and a calibration table storage configured to store the first data for adjusting the height of the overdrive current and the second data for adjusting the width of the overdrive current. The test cell array is arranged to correspond to the memory cell array.

In another embodiment, a driver for a semiconductor memory, the driver may include: a digital/analog (D/A) conversion circuit configured to output a spike current that includes a target current and an overdrive current, the overdrive current having a height and a width; a memory cell array including a cell into which the spike current flows to write data in the cell; and a spike current control circuit configured to receive height adjusting data and width adjusting data and control the height and width of the overdrive current. The spike current control circuit may include: a D/A converter configured to convert the height adjusting data into an analog current; a height adjusting capacitor configured to receive the analog current and be charged to a charging voltage, a level of the charging voltage being determined based on the height of the overdrive current; a short pulse generator configured to generate a short pulse signal based on the width adjusting data, a turn-on time of the short pulse signal being determined based on the width of the overdrive current; and a width adjusting switch configured to couple the height adjusting capacitor to a gate terminal of a dropping voltage transmission switch in response to the short pulse signal.

The height of the overdrive current is proportional to a distance between the cell and the D/A conversion circuit, and the width of the short pulse signal is inversely proportional to the distance between the cell and the D/A conversion circuit.

DETAILED DESCRIPTION

Figure 1:
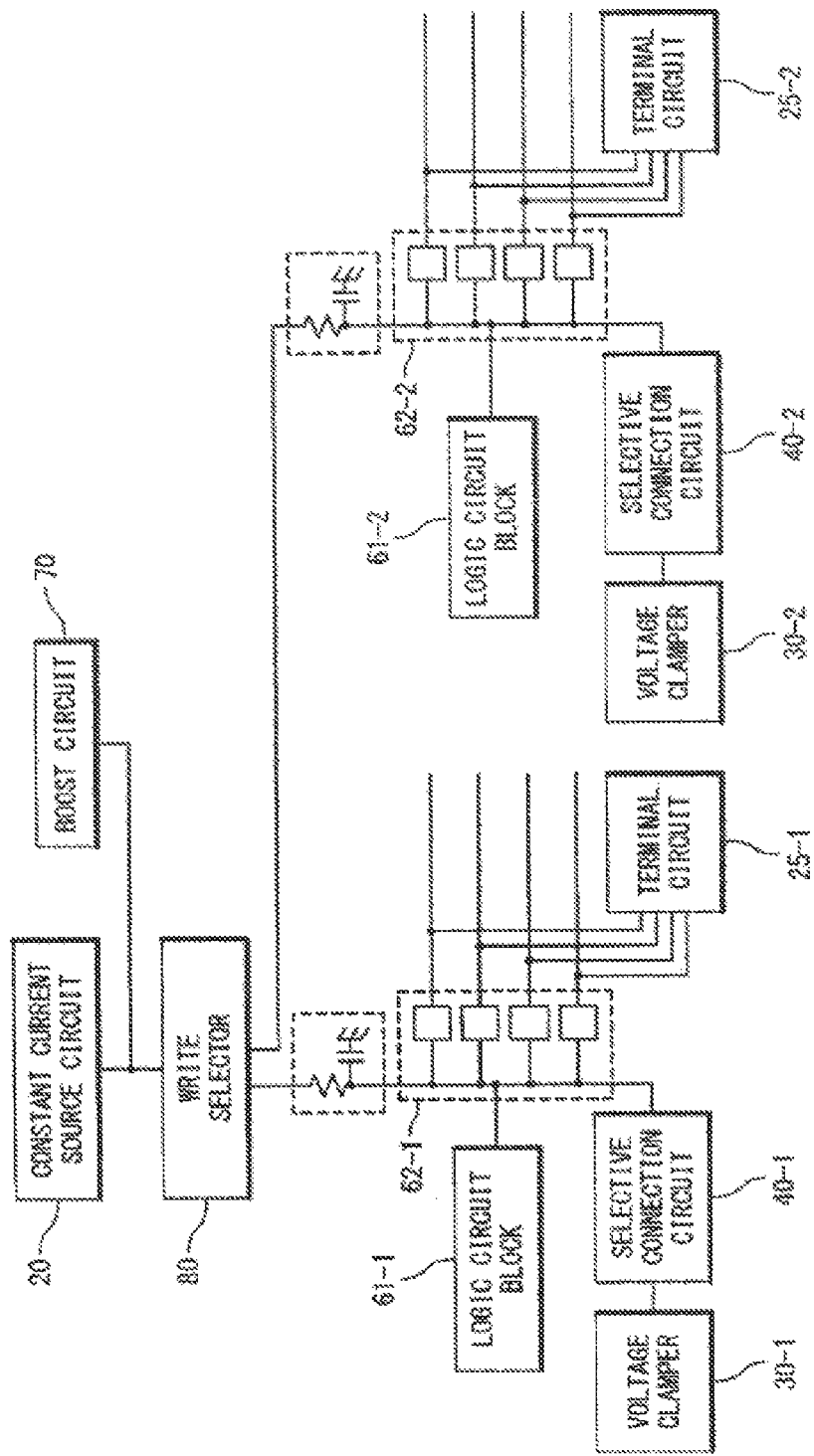
FIG. 1 is a circuit diagram of a conventional semiconductor integrated circuit.

Various embodiments will be described below in more detail with reference to the accompanying drawings. Embodiments may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 2:
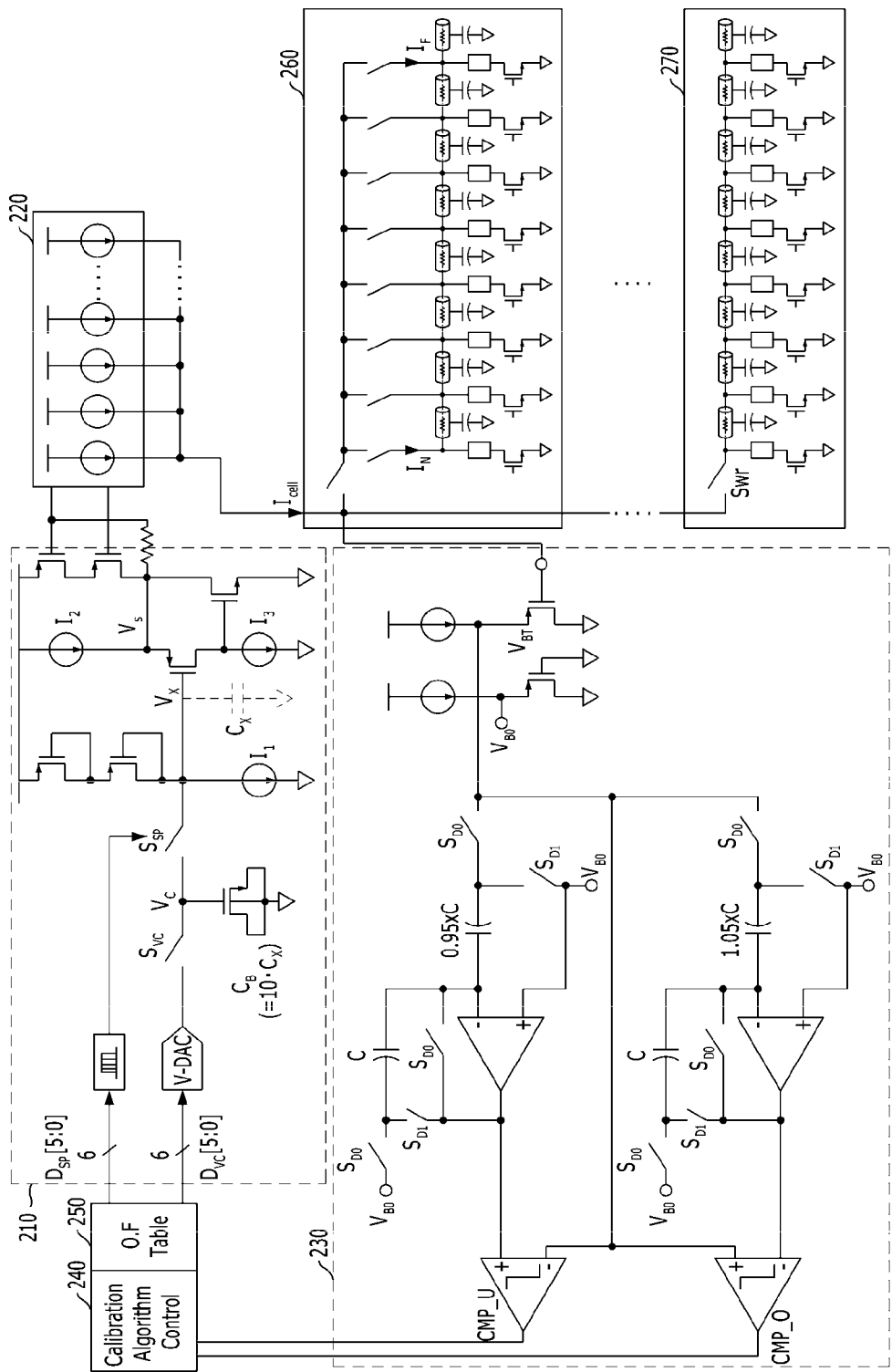
FIG. 2 is a block diagram of a driver for a semiconductor memory in accordance with an embodiment.

FIG. 2 is a block diagram of a driver for a semiconductor memory in accordance with an embodiment.

The driver for a semiconductor memory may include a momentarily dropping voltage generation circuit (or a spike current control circuit) 210, a current digital/analog (D/A) conversion circuit 220, a cell voltage detection circuit 230, a calibration controller 240, a calibration table storage 250, a test cell array 260, and a memory cell array 270.

The momentarily dropping voltage generation circuit 210 may generate a momentarily dropping voltage using data (or height adjusting data) Dvc[5:0] for adjusting a height of an overdrive current to be written to a memory cell and data (or width adjusting data) Dsp[5:0] for adjusting a width of the overdrive current. In an embodiment, a spike current includes the overdrive current, and the height and width of the overdrive current corresponds to the maximum magnitude and a duration of the overdrive current, respectively.

The current D/A conversion circuit 220 may output a spike current using the momentarily dropping voltage. The spike current may be obtained by summing up a target current and the overdrive current. Although not illustrated, multi-level data may be stored in a memory cell because the magnitude of the target current may be set by controlling a part or all of a plurality of current sources included in the current D/A conversion circuit 220 according to a switching signal applied from outside the semiconductor memory.

The cell voltage detection circuit 230 may compare a charging voltage, which depends on the spike current and is applied to a cell within the test cell array 260, to a predetermined reference value, and output a comparison signal.

The calibration controller 240 may calibrate the height and width of the overdrive current using the comparison signal output from the cell voltage detection circuit 230.

The calibration table storage 250 may store data Dvc[5:0] for adjusting the height of an overdrive current and data Dsp[5:0] for adjusting the width of the overdrive current, the height and width of the overdrive current are adjusted to correspond to each cell within the memory cell array 270. The calibration table storage 250 may include a lookup table.

The test cell array 260 may be arranged to correspond to the memory cell array 270. The test cell array 260 may have parasitic resistance and capacitance components which are identical or similar to those of the corresponding memory cell array 270. For example, the test cell array 260 may be located close to the memory cell array 270, or arranged in a dummy area spaced apart from the memory cell array 270 so as to have a wiring environment similar to the memory cell array 270. The test cell array 260 may be used to control the overdrive current provided to the memory cell array 270.

In accordance with an embodiment, the test cell array 260 may be arranged to correspond to the memory cell array 270, such that the test cell array 260 has one-to-one correspondence to the memory cell array 270. For example, each of cells in the test cell array 260 has a corresponding one of cells in the memory cell array 270, such that a first overdrive current flowing into a cell in the test cell array 260 has substantially the same height and width as those of a second overdrive current flowing into a corresponding cell in the memory cell array 270 under the same operation condition. In another embodiment, a single test cell array 260 may be configured to correspond to a plurality of memory cell arrays 270.

Figure 3A:
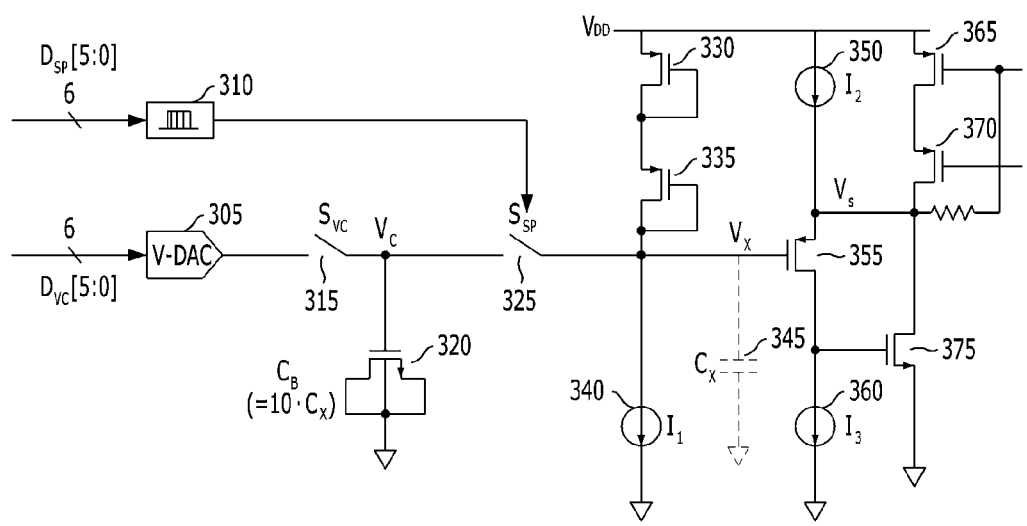
FIG. 3A is a circuit diagram of a momentarily dropping voltage generation circuit included in the driver shown in FIG. 2.
Figure 3B:
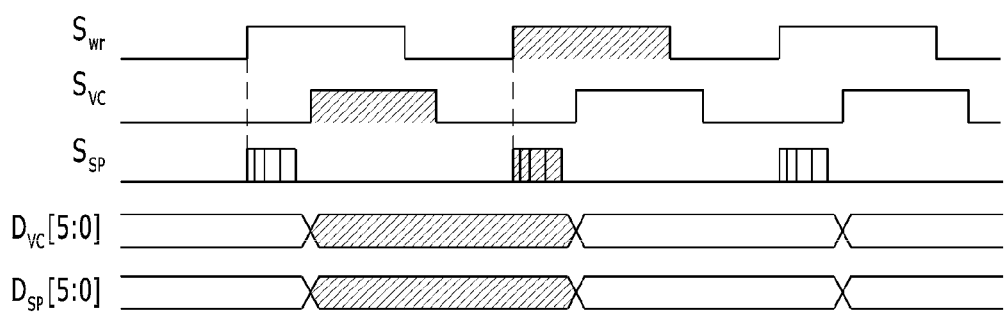
FIG. 3B illustrates waveforms of signals related to an operation of the momentarily dropping voltage generation circuit shown in FIG. 3A.
Figure 4A:
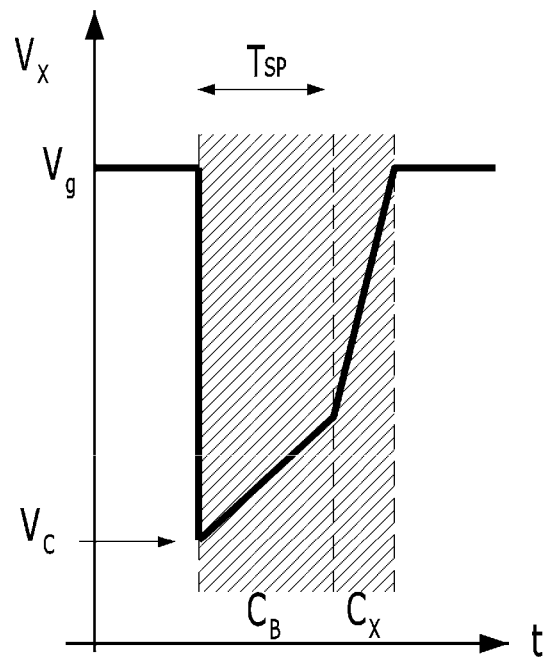
FIG. 4A illustrates a waveform of a momentarily dropping voltage in accordance with an embodiment.
Figure 4B:
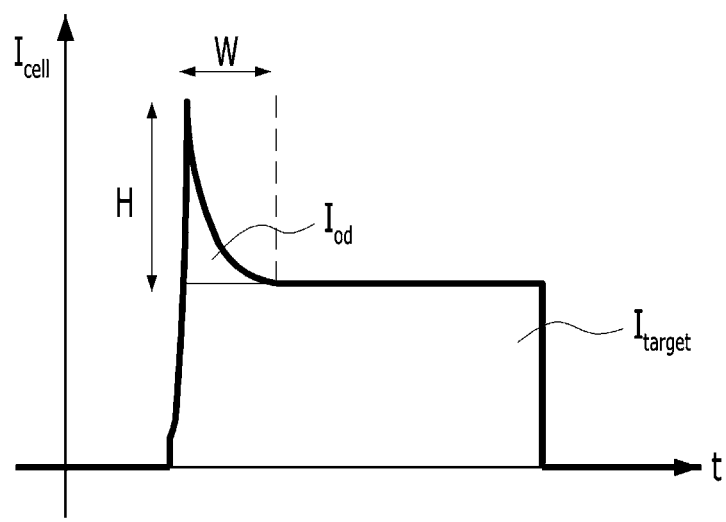
FIG. 4B illustrates a waveform of a spike current in accordance with an embodiment.

FIG. 3A is a circuit diagram of the momentarily dropping voltage generation circuit 210 included in the driver shown in FIG. 2. FIG. 3B illustrates waveforms of signals related to an operation of the momentarily dropping voltage generation circuit 210 shown in FIG. 3A. FIG. 4A illustrates a momentarily dropping voltage generated by a momentarily dropping voltage generation circuit in accordance with an embodiment. FIG. 4B illustrates a spike current in accordance with an embodiment.

Referring to FIG. 3A, the momentarily dropping voltage generation circuit 210 includes a digital/analog (D/A) converter 305, a short pulse generator 310, a height adjusting switch 315, a height adjusting capacitor 320, a width adjusting switch 325, first and second diodes 330 and 335, a first current source 340, a parasitic capacitor 345, a second current source 350, a dropping voltage transmission switch 355, a third current source 360, and current D/A conversion circuit driving signal switches 365, 370, and 375.

The D/A converter 305 may convert the data Dvc[5:0] for adjusting the height of the overdrive current into an analog current. The data Dvc[5:0] is output from the calibration table storage 250 in FIG. 2.

The short pulse generator 310 may generate a short pulse signal Ssp using the data Dsp[5:0] for adjusting the width of the overdrive current. The data Dsp[5:0] is also output from the calibration table storage 250 in FIG. 2.

During a certain period of time before a corresponding write signal Swr (see FIGS. 2 and 3B) is applied to the memory cell array 270, a signal Svc for adjusting the height of the overdrive current is applied to turn on the height adjusting switch 315. During the period, the height adjusting capacitor 320 may be charged to have a level of a charging voltage Vc at a terminal of the capacitor 320 using an output of the D/A converter 305. After the period, the height adjusting switch 315 is turned off. In an embodiment, the level of the charging voltage Vc is determined based on an amount of the analog current output from the D/A converter 305, an on-time duration of the signal Svc, or both.

When the short pulse signal Ssp is applied to the width adjusting switch 325, an instantaneous dropping voltage may be generated at a gate terminal of the dropping voltage transmission switch 355, as illustrated in FIG. 4A. When the width adjusting switch 325 is turned on, the gate terminal of the dropping voltage transmission switch 355 is connected to the terminal of the height adjusting capacitor 320. The charging voltage Vc at the terminal of the height adjusting capacitor 320 is lower than a gate voltage Vg of the dropping voltage transmission switch 355, wherein the gate voltage Vg is a voltage applied to the gate terminal of the dropping voltage transmission switch 355 before the width adjusting switch 325 is turned on. As a result of a difference between the charging voltage Vc and the gate voltage Vg, a voltage Vx at the gate terminal of the dropping voltage transmission switch 355 may drop from the gate voltage Vg to the charging voltage Vc as soon as the width adjusting switch 325 is turned on. After that, since the capacitance $C_B$ of the height adjusting capacitor 320 has a relatively large value, for example, a value that is ten times larger than the capacitance Cx of the parasitic capacitor 345, the gate terminal voltage Vx of the dropping voltage transmission switch 355 may gradually rise during a period $T_{SP}$ in which the short pulse signal Ssp is applied to the width adjusting switch 325. Then, after the period $T_{SP}$, the terminal of the height adjusting capacitor 320 is disconnected from the gate terminal of the dropping voltage transmission switch 355. Thus, the gate terminal voltage Vx of the dropping voltage transmission switch 355 may rapidly rise to the gate voltage Vg.

The first and second diodes 330 and 335 are voltage dropping diodes which are used to apply a power supply voltage $V_{DD}$ to the gate terminal of the dropping voltage transmission switch 355 when the gate terminal voltage Vx drops below a predetermined voltage level. The power supply voltage $V_{DD}$ may be an external voltage supply.

The first current source 340 may be arranged between a ground terminal and the gate terminal of the dropping voltage transmission switch 355, the second current source 350 may be arranged between a terminal of the power supply voltage $V_{DD}$ and the dropping voltage transmission switch 355, and the third current source 360 may be arranged between the dropping voltage transmission switch 355 and the ground terminal so that the gate terminal voltage Vx maintains a voltage level corresponding to the gate voltage Vg before and after the width adjusting switch 325 is turned on.

The gate terminal voltage Vx of the dropping voltage transmission switch 355 and a source terminal voltage Vs d of the dropping voltage transmission switch 355 may have substantially the same waveform. In an embodiment, the source terminal voltage Vs may have substantially the same waveform as that of the gate terminal voltage Vx shown in FIG. 4A.

A pair of switches, that is, the first switch 365 and the second switch 370 among the current D/A conversion circuit driving signal switches 365, 370, and 375 are connected to each of a plurality of current sources in the current D/A conversion circuit 220 in a manner of a current mirror. Since the source terminal voltage Vs is applied to a first switch 365 among the current D/A conversion circuit driving signal switches 365, 370, and 375, a high current may flow through the first switch 365 when the charging voltage Vc of the height adjusting capacitor 320 is applied to the gate terminal of the dropping voltage transmission switch 355. It will be apparent to those skilled in the art. As a result, a spike current (or a cell current) Icell including an overdrive current Iod and a target current Itarget may flow through a memory cell, as illustrated in FIG. 4B.

Figure 5:
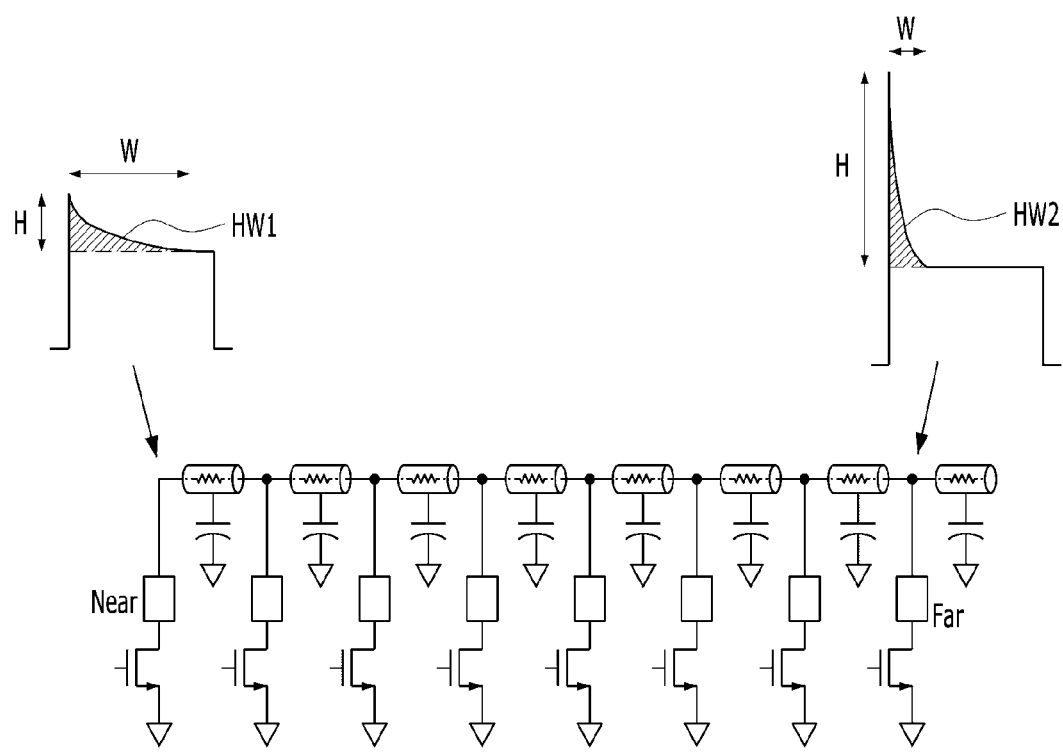
FIG. 5 illustrates waveforms of a spike current depending on a distance of a memory cell from a digital/analog (D/A) conversion circuit shown in FIG. 2, in accordance with an embodiment.

FIG. 5 illustrates waveforms of a spike current depending on a distance of each memory cell from the current D/A conversion circuit 220 shown in FIG. 2, in accordance with an embodiment. In an embodiment, the distance corresponds to a total length of electrical connections between a memory cell and an output node of the current D/A conversion circuit 220.

When a memory cell is near to the current D/A conversion circuit 220, the width W of the overdrive current Iod may be increased while the height H of the overdrive current Iod is reduced. However, when a memory cell is far from the current D/A conversion circuit 220, the width W of the overdrive current Iod may be reduced while the height H of the overdrive current Iod is increased.

In accordance with the embodiment shown in FIG. 5, the amount of charges HW1 provided by the overdrive current Iod flowing into the memory cell near to the current D/A conversion circuit 220 is controlled to be substantially the same as the amount of charges HW2 provided by the overdrive current Iod flowing into the memory cell far from the current D/A conversion circuit 220.

Figure 6:
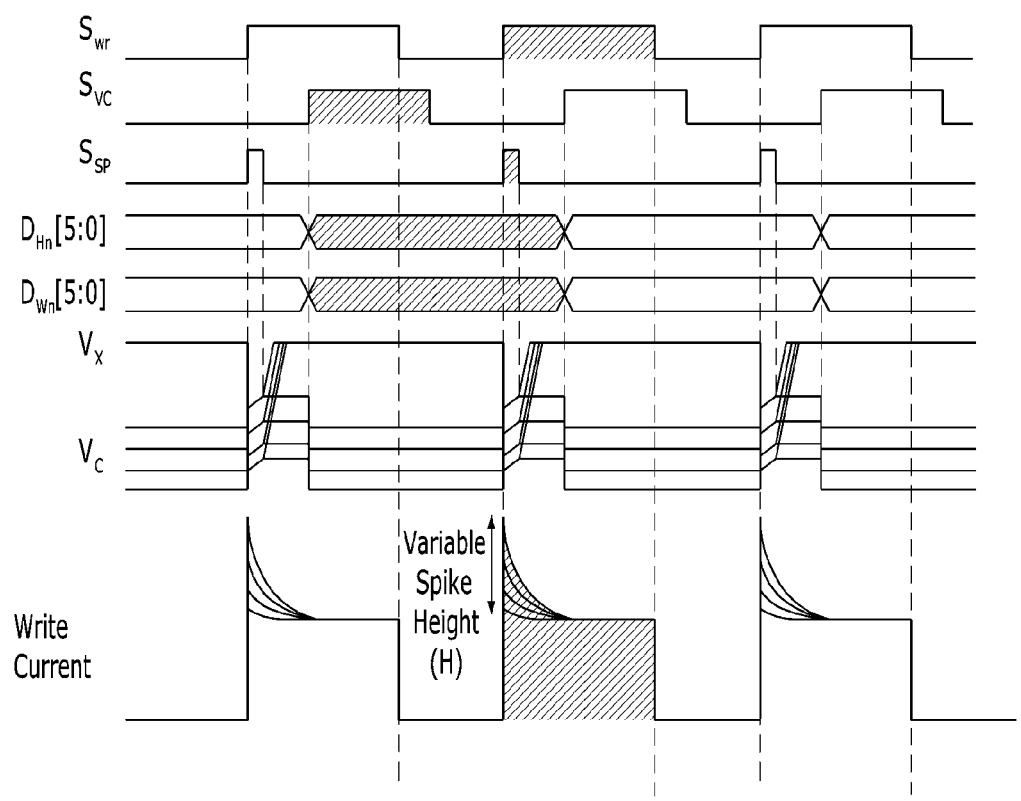
FIG. 6 illustrates waveforms of signals related to adjusting a height of an overdrive current in accordance with an embodiment.

FIG. 6 illustrates waveforms of signals related to adjusting a height of an overdrive current in accordance with an embodiment. In accordance with the embodiment shown in FIG. 6, a level of the charging voltage Vc at the terminal of the height adjusting capacitor 320 before the short pulse signal Ssp turns on the width adjusting switch 325 may be controlled by adjusting an amount of charges stored in the height adjusting capacitor 320, thereby adjusting the height H of the overdrive current Iod. As described above, the level of the charging voltage Vc is determined based on an amount of the analog current output from the D/A converter 305, an on-time duration of the signal Svc, or both. In an embodiment, as the level of the charging voltage Vc decreases, the height H of the overdrive current Iod increases.

Figure 7:
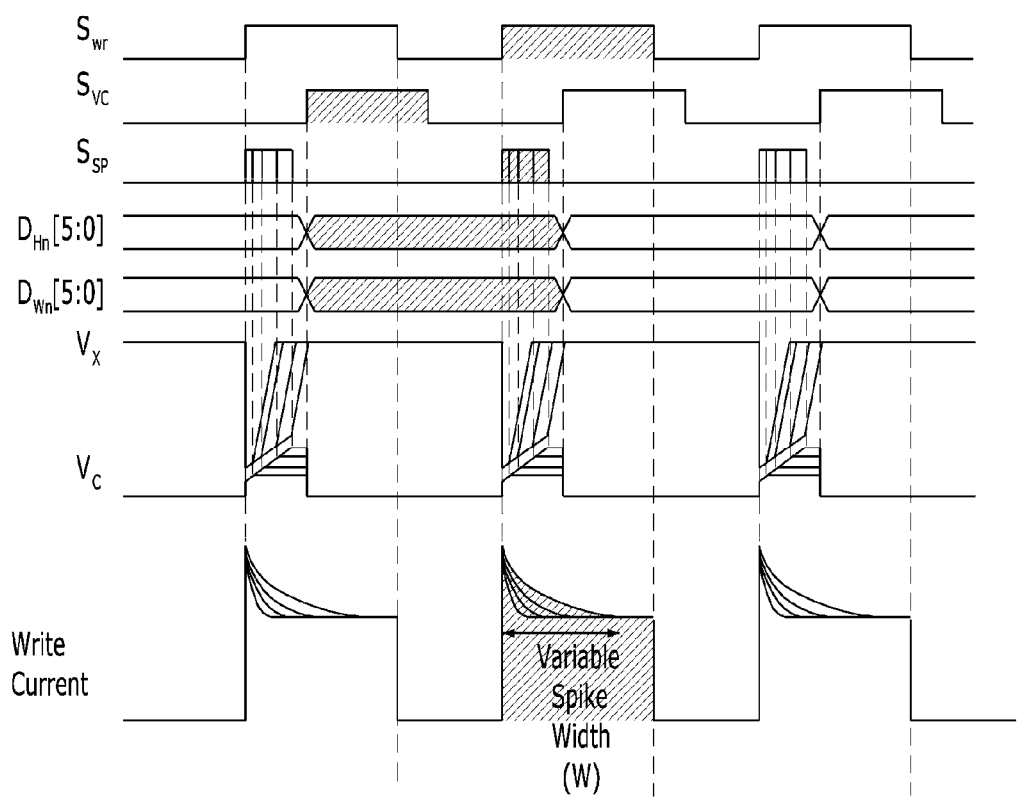
FIG. 7 illustrates waveforms of signals related to adjusting a width of an overdrive current in accordance with an embodiment.

FIG. 7 illustrates waveforms of signals related to adjusting a width of an overdrive current in accordance with an embodiment. In accordance with the embodiment shown in FIG. 7, a turn-on time of the short pulse signal Ssp output from the short pulse generator 310 may be controlled to adjust the width W of the overdrive current Iod. In an embodiment, as a duration of the turn-on time increases, the width W of the overdrive current Iod increases.

That is, the level of the charging voltage Vc that varies with the charges stored in the height adjusting capacitor 320 and the duration of the turn-on time of the short pulse signal Ssp output from the short pulse generator 310 may be controlled to adjust the height H and the width W of the overdrive current Iod, respectively.

Figure 8A:
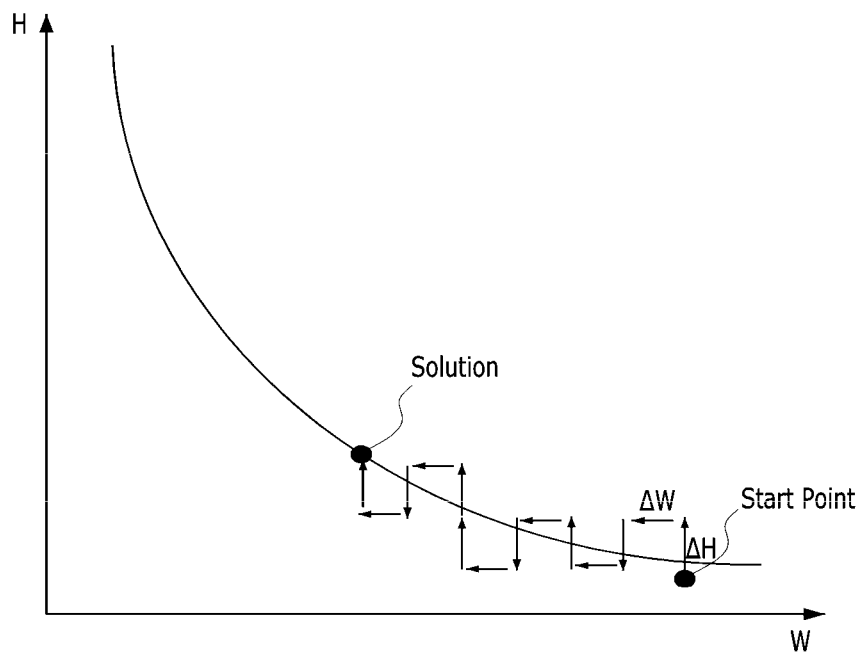
FIG. 8A illustrates a search algorithm of determining a height and a width of a spike current in accordance with an embodiment.

FIG. 8A illustrates a search algorithm performed by the calibration controller 240 shown in FIG. 2 in accordance with an embodiment.

In an overdrive current curve in accordance with the embodiment shown in FIG. 8A, the product of a height H and a width W of an overdrive current is constant. A start point for determining the height H and the width W of the overdrive current flowing in a predetermined memory cell may be positioned under or over the overdrive current curve. For example, when a start point is placed under the overdrive current curve, the start point may shift to a position over the overdrive current curve. On the contrary, when a start point is placed over the overdrive current curve, the start point may shift to a position under the overdrive current curve.

When the search algorithm is performed, the following conditions may be satisfied.

First, a search point shifts in a direction that the width W of the overdrive current remains the same or decreases.

Second, when the search point does not cross the overdrive current curve during the shift, the direction is maintained.

In an embodiment, at a first step, the search point shifts in a vertical direction upward or downward by a predetermined amount ΔH such that the width W of the overdrive current remains the same.

At a second step, when the search point does not cross the overdrive current curve during the first step, the search point continues to shift in the vertical direction by the predetermined amount ΔH. When the search point crosses the overdrive current curve during the first step, the search point shifts in a horizontal direction by a predetermined amount ΔW such that the height H of the overdrive current remains the same. The above first and second steps are repeated until the search point substantially is positioned on the overdrive current curve. The overdrive current flowing through a corresponding memory cell may be set to have the height H and width W when the search point is positioned on the overdrive current curve, and the values of the height H and width W at that time may be stored in the calibration table storage 250.

Figure 8B:
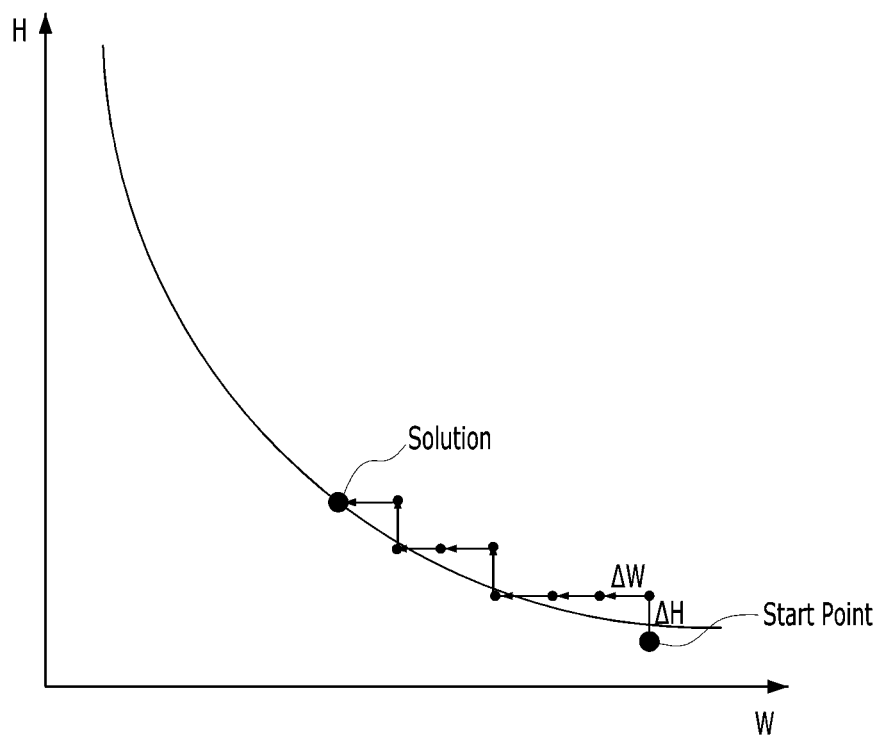
FIG. 8B illustrates a search algorithm of determining a height and a width of a spike current in accordance with another embodiment.

FIG. 8B illustrates a search algorithm performed by the calibration controller 240 in accordance with another embodiment.

A start point for determining the height H and the width W of an overdrive current flowing in a predetermined memory cell may be positioned under or over the overdrive current curve. For example, when the start point is placed under the overdrive current curve, the start point may move to a position over the overdrive current curve. On the contrary, when the start point is placed over the overdrive current curve, the start point may move a position under the overdrive current curve.

When the search algorithm is performed, the following conditions may be satisfied.

First, a search point shifts in a direction that the width W of the overdrive current remains the same or decreases.

Second, when the search point does not cross the overdrive current curve during the shift, the search point shifts in a direction that the width W of the overdrive current decreases.

In an embodiment, at a first step, the search point shifts in a vertical direction by a predetermined amount ΔH such that the width W of the overdrive current remains the same.

At a second step, the search point shifts in a horizontal direction by a predetermined amount ΔW such that the height H of the overdrive current remains the same.

At a third step, if the search point does not cross the overdrive current curve during the second step, the search point continues to shift in the horizontal direction by the predetermined amount ΔW. On the other hand, if the search point crosses the overdrive current curve during the second step, the search point moves in a vertical direction by a predetermined amount ΔH such that the width W of the overdrive current remains the same.

The above first to third steps are repeated until the search point substantially is positioned on the overdrive current curve. The overdrive current flowing through a corresponding memory cell may be set to have the height H and width W when the search point is positioned on the overdrive current curve, and values of the height H and width W at that time may be stored in the calibration table storage 250.

Figure 9A:
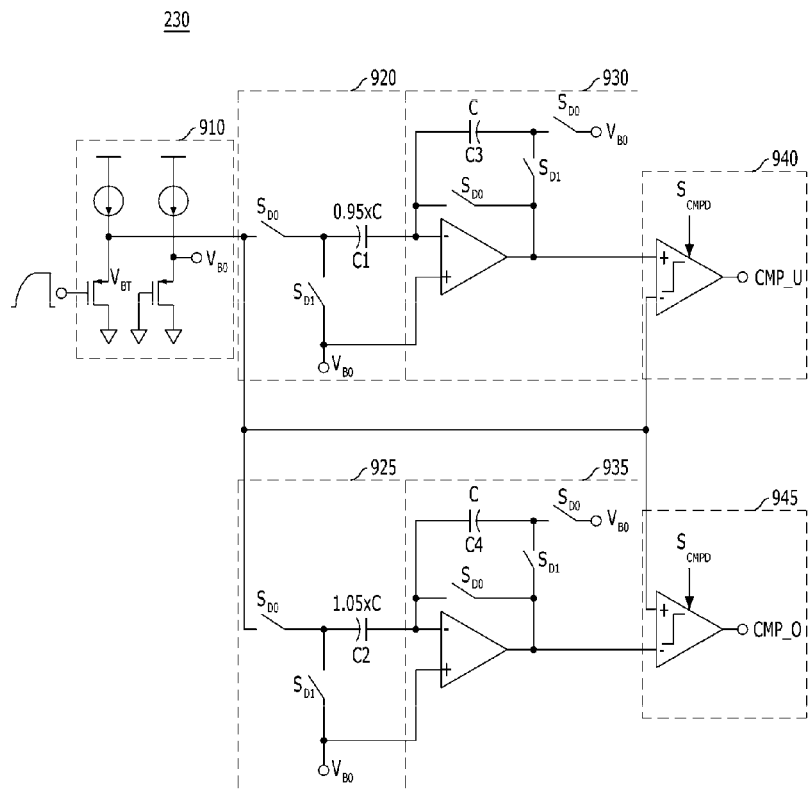
FIG. 9A is a circuit diagram of a cell voltage detection circuit shown in FIG. 2 in accordance with an embodiment.
Figure 9B:
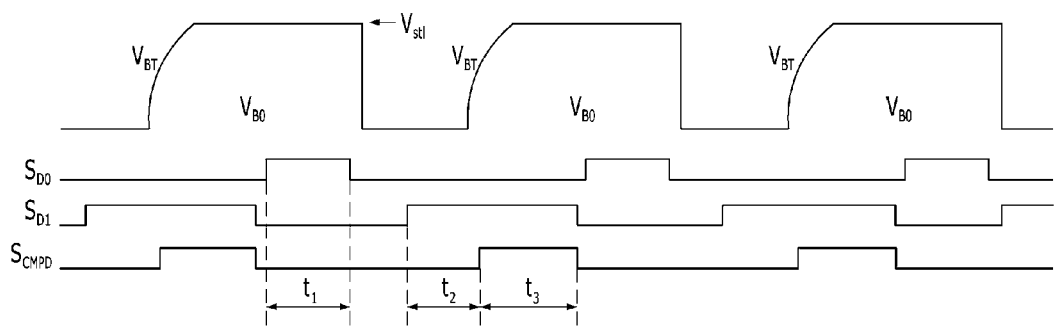
FIG. 9B illustrates waveforms of signals related to an operation of the cell voltage detection circuit shown in FIG. 9A in accordance with an embodiment.

FIG. 9A is a circuit diagram of the cell voltage detection circuit 230 shown in FIG. 2 in accordance with an embodiment. FIG. 9B illustrates waveforms of signals related to an operation of the cell voltage detection circuit 230 shown in FIG. 9A in accordance with an embodiment. In order to evaluate the height and width of an overdrive current which is determined according to the search algorithm shown in FIGS. 8A and 8B, the cell voltage detection circuit 230 may compare a memory cell voltage based on the overdrive current to a predetermined reference voltage, and output a comparison signal.

The cell voltage detection circuit 230 in accordance with the embodiment shown in FIG. 9A may include a cell current detector 910, a first voltage sampler 920, a second voltage sampler 925, a first amplifier 930, a second amplifier 935, a first comparator 940, and a second comparator 945.

The cell current detector 910 may detect a cell current flowing through a test cell, and output a cell voltage (or a cell voltage) $V_{BT}$ corresponding to a cell current. For each period of the cell voltage $V_{BT}$, the cell voltage $V_{BT}$ initially increases and then becomes stabilized (i.e., saturated to have a substantially constant level).

During a first period t1 in which a first control signal $S_{D0}$ is enabled while second and third control signals $S_{D1}$ and $S_{CMPD}$ are disabled, the first voltage sampler 920 may be connected to the cell current detector 910 in response to the first control signal $S_{D0}$, and sample a stabilized cell voltage Vstl and store the sampled voltage in a first capacitor C1 that has a capacitance value 0.95×C equal to 0.95 times of a capacitance value C of third and fourth capacitors C3 and C4. During the first period t1, the second voltage sampler 925 may sample the stabilized cell voltage Vstl and store the sampled voltage in a second capacitor C2 that has a capacitance value 1.05×C equal to 1.05 times of the capacitance value C of the third and fourth capacitors C3 and C4.

During a second period t2 in which the second control signal $S_{D1}$ is enabled while the first and third control signals $S_{D0}$ and $S_{CMPD}$ are disabled, the first and second samplers 920 and 925 may be disconnected from the cell current detector 910, and the first amplifier 930 may amplify a cell voltage output from the first voltage sampler 920 and output a first reference voltage that has a level 0.95Vstl equal to 0.95 times of a level of the stabilized cell voltage Vstl. During the second period t2, the second amplifier 935 may amplify a cell voltage output from the second voltage sampler 925 and output a second reference voltage that has a level 1.05Vstl equal to 1.05 times of the level of the stabilized cell voltage Vstl.

During a third period t3 in which the second and third control signals $S_{D1}$ and $S_{CMPD}$ are enabled while the first control signal $S_{D0}$ is disabled, the first comparator 940 may compare the cell voltage $V_{BT}$ and the first reference voltage, and output a first H-level state signal that has a logic high value when an undershoot occurs by the cell voltage $V_{BT}$ lower than the first reference voltage.

During the third period t3, the second comparator 945 may compare the cell voltage $V_{BT}$ and the second reference voltage, and output a second H-level state signal that has a logic high value when an overshoot occurs by the cell voltage $V_{BT}$ higher than the second reference voltage.

In accordance with the embodiment shown in FIGS. 9A and 9B, the process of searching for the width and height of an overdrive current for each test cell may be repeated until an undershoot or overshoot does not occur.

Figure 10:
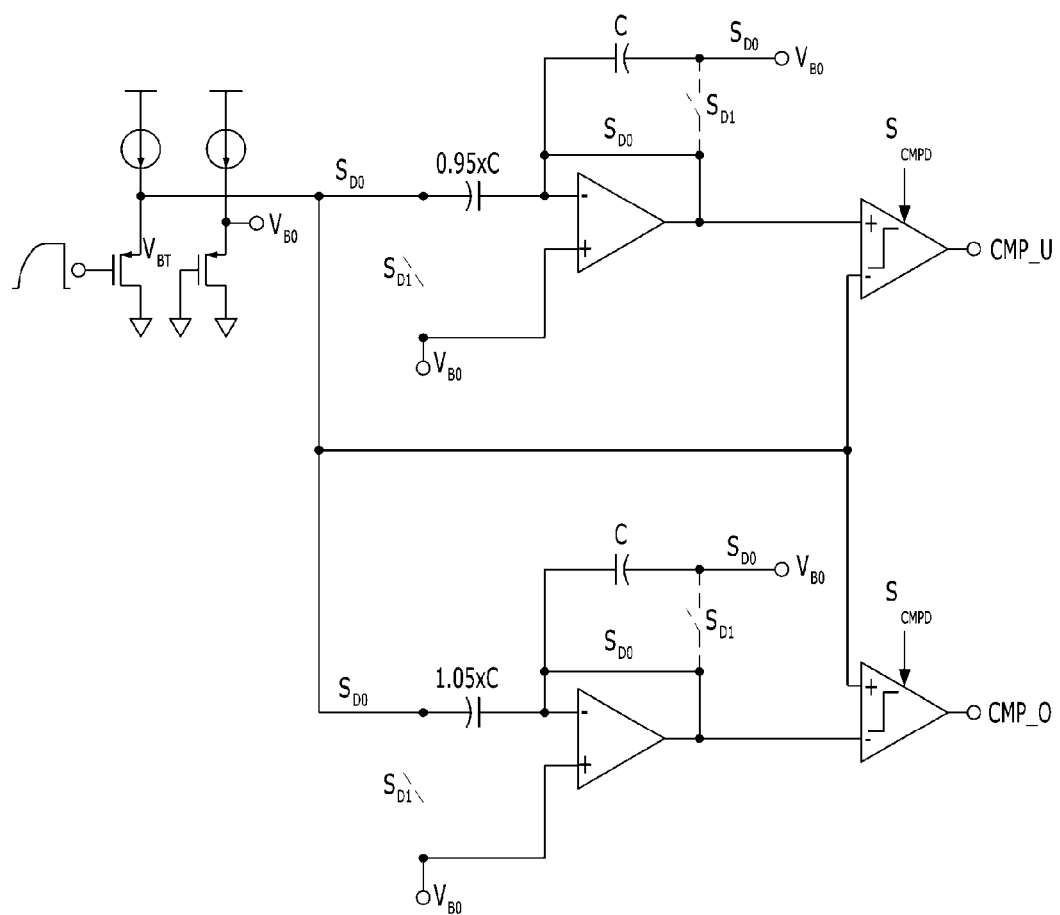
FIG. 10 illustrates activated elements of the cell voltage detection circuit shown in FIG. 9A when a cell voltage is sampled.
Figure 11:
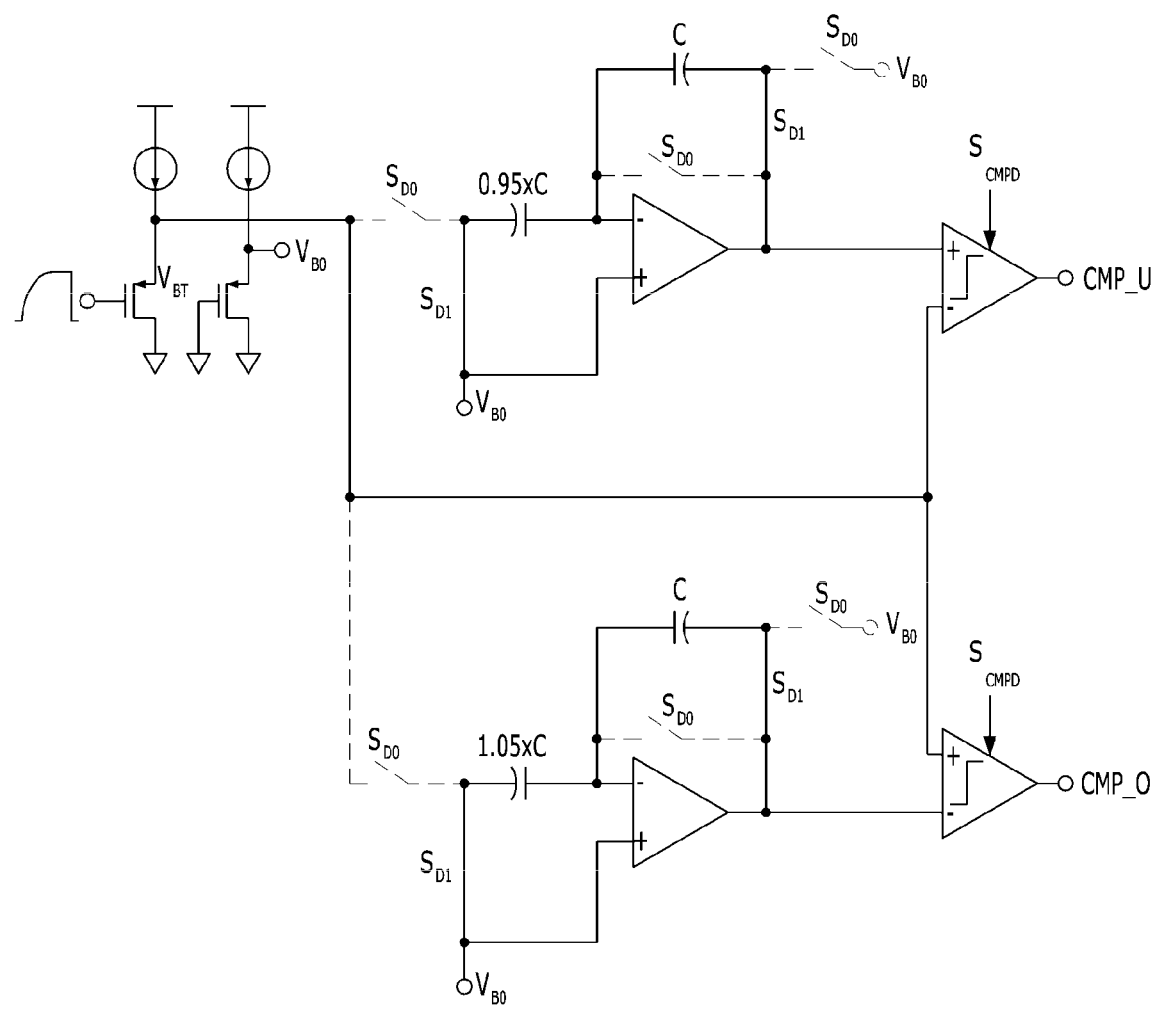
FIG. 11 illustrates activated elements of the cell voltage detection circuit shown in FIG. 9A when sampled voltages are amplified and then are compared with a cell voltage.

FIG. 10 illustrates activated elements of the cell voltage detection circuit 230 when the cell voltage Vstl is sampled by the first and second samplers 920 and 925. FIG. 11 illustrates activated elements of the cell voltage detection circuit 230 when the sampled cell voltages are amplified by the first and second amplifiers 930 and 935, respectively, and then the amplified voltages are compared with the cell voltage $V_{BT}$, by the first and second comparators 940 and 945, respectively.

Figure 12:
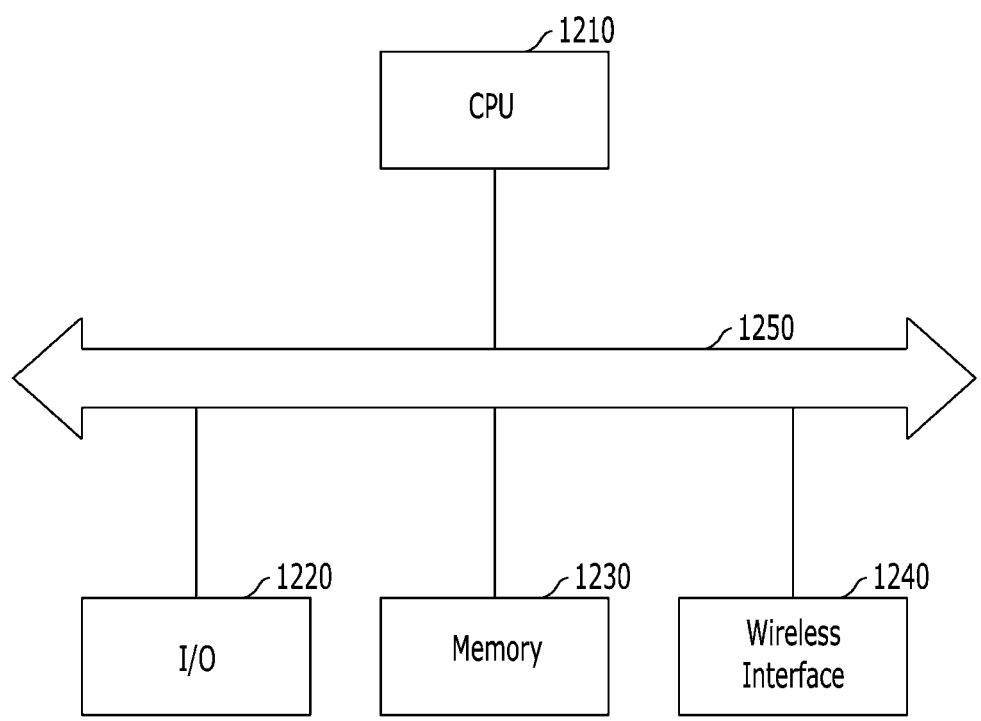
FIG. 12 illustrates a system that includes a memory in accordance with an embodiment.

FIG. 12 illustrates a system that includes a memory in accordance with an embodiment.

The system in accordance with the embodiment shown in FIG. 12 may be used in a personal digital assistant (PDA), a portable computer having a wireless communication ability, a tablet computer, a mobile phone, a digital music player, a digital camera, or a wireless device capable of wirelessly transmitting and receiving information. The system in accordance with this embodiment may be used in any one of WPAN (Wireless Personal Area Network), WLAN (Wireless Local Area Network), and WAN (Wireless Area Network) such as 2G, 3G, 4G, or 5G network.

The system in accordance with the embodiment shown in FIG. 12 may include a CPU 1210, an I/O interface 1220, a memory 1230, and a wireless interface 1240, which are coupled to each other through a bus 1250. A driver for a semiconductor memory in accordance with an embodiment may be implemented in the memory 1230.

The CPU 1210 may include one or more microprocessors, digital signal processing devices, or micro controllers. The memory 1230 may store information which is to be transmitted to the system. The memory 1230 may include one or more different types of memories such as volatile memories and nonvolatile memories, for example.

The I/O interface 1220 may include a keypad, a display, a microphone, a mouse, a camera, or a sensor, and a user may use the I/O interface 1220 to generate information.

The wireless interface 1240 may be used to exchange information with a wireless communication network.

In accordance with an embodiment of the present disclosure, a driver for a semiconductor memory may reduce an error in writing data by controlling the amount of charges supplied to each memory cell within a predetermined range. In an embodiment, the amount of charges is controlled by adjusting the height and width of a spike current, when memory cells in which data having the same level are written are arranged at different distances.

Although various embodiments have been described for illustrative purposes, it will be apparent to those skilled in the art that various changes and modifications may be made without departing from the spirit and scope of the invention as defined in the following claims.

What is claimed is:

1. A driver for a semiconductor memory, comprising:
a momentarily dropping voltage generation circuit configured to generate a momentarily dropping voltage using first data for adjusting a height of an overdrive current that flows into a cell of a memory cell array and second data for adjusting a width of the overdrive current;
a digital/analog (D/A) conversion circuit configured to output a first spike current that includes the overdrive current using the momentarily dropping voltage;
a cell voltage detection circuit configured to compare a cell voltage to a predetermined reference voltage, and to output a comparison signal representing the comparison result, the cell voltage being generated based on a second spike current that flows into a cell of a test cell array;
a calibration controller configured to calibrate the height and width of the overdrive current using the comparison signal output from the cell voltage detection unit; and
a calibration table storage configured to store the first data for adjusting the height of the overdrive current and the second data for adjusting the width of the overdrive current,
wherein the test cell array is arranged to correspond to the memory cell array.

2. The driver of claim 1, wherein the momentarily dropping voltage generation circuit comprises:
a D/A converter configured to convert the first data output from the calibration table storage into an analog current;
a short pulse generator configured to generate a short pulse signal using the second data output from the calibration table storage;
a height adjusting capacitor configured to receive the analog current and including a terminal to be charged to a charging voltage, a level of the charging voltage being determined based on the height of the overdrive current; and
a width adjusting switch configured to couple the terminal of the height adjusting capacitor to a gate terminal of a dropping voltage transmission switch in response to the short pulse signal.

3. The driver of claim 1, wherein the cell of the memory array is a first cell arranged at a first position within the memory cell array, the overdrive current is a first overdrive current, the height of the overdrive current is a first height, and the width of the overdrive current is a first width,
wherein the memory cell array includes a second cell arranged at a second position within the memory cell array, and a second overdrive current flows into the second cell, the second overdrive current having a second height and a second width,
wherein a distance between the first cell and the D/A conversion circuit is less than a distance between the second cell and the D/A conversion circuit, and
wherein the first height of the first overdrive current is smaller than the second height of the second overdrive current, and the first width of the first overdrive current is greater than the second width of the second overdrive current.

4. The driver of claim 3, wherein an amount of charges generated by the first overdrive current flowing into the first cell is substantially equal to that of charges generated by the second overdrive current flowing into second the cell.

5. The driver of claim 2, wherein the charging voltage at the terminal of the height adjusting capacitor is controlled to adjust the height of the overdrive current.

6. The driver of claim 2, wherein a turn-on time of the short pulse signal output from the short pulse generator is controlled to adjust the width of the overdrive current.

7. The driver of claim 1, wherein the calibration controller performs a search algorithm and, when, in the search algorithm, a search point has shifted in a direction to maintain or reduce the width of the overdrive current, the calibration controller controls the search point to move in the direction when the search point does not cross the overdrive current curve during the shift.

8. The driver of claim 1, wherein the calibration controller performs a search algorithm and, when, in the search algorithm, a search point has shifted in a first direction to maintain or reduce the width of the overdrive current, the calibration controller controls the search point to move in a second direction to reduce the width of the overdrive current when the search point does not cross the overdrive current curve during the shift.

9. The driver of claim 1, wherein the cell voltage detection circuit comprises:
a cell current detector configured to output the cell voltage;
first and second voltage samplers configured to sample the cell voltage after the cell voltage becomes stabilized, the first and second voltage samplers storing first and second sampled voltages in first and second capacitors, respectively;
first and second amplifiers configured to amplify voltages output from the first and second voltage samplers into first and second reference voltages, respectively; and
first and second comparators configured to compare the cell voltage before the cell voltage becomes stabilized to the first and second reference voltages, respectively.

10. A system comprising:
a memory comprising a driver;
an I/O interface used by a user to generate information;
a wireless interface configured to exchange information with a wireless communication network; and
a CPU configured to control the memory, the I/O interface, and the wireless interface,
wherein the driver comprising:
a momentarily dropping voltage generation circuit configured to generate a momentarily dropping voltage using first data for adjusting a height of an overdrive current that flows into a cell of a memory cell array and second data for adjusting a width of the overdrive current;
a digital/analog (D/A) conversion circuit configured to output a first spike current that includes the overdrive current using the momentarily dropping voltage;
a cell voltage detection circuit configured to compare a cell voltage to a predetermined reference voltage, and to output a comparison signal representing the comparison result, the cell voltage being generated based on a second spike current that flows into a cell of a test cell array;
a calibration controller configured to calibrate the height and width of the overdrive current using the comparison signal output from the cell voltage detection unit; and
a calibration table storage configured to store the first data for adjusting the height of the overdrive current and the second data for adjusting the width of the overdrive current, wherein the test cell array is arranged to correspond to the memory cell array.

11. The system of claim 10, wherein the momentarily dropping voltage generation circuit comprises:
- a D/A converter configured to convert the first data output from the calibration table storage into an analog current;
- a short pulse generator configured to generate a short pulse signal using the second data output from the calibration table storage;
- a height adjusting capacitor configured to receive the analog current and including a terminal to be charged to a charging voltage, a level of the charging voltage being determined based on the height of the overdrive current; and
- a width adjusting switch configured to couple the terminal of the height adjusting capacitor to a gate terminal of a dropping voltage transmission switch in response to the short pulse signal.

12. The system of claim 10, wherein the cell of the memory array is a first cell arranged at a first position within the memory cell array, the overdrive current is a first overdrive current, the height of the overdrive current is a first height, and the width of the overdrive current is a first width,
wherein the memory cell array includes a second cell arranged at a second position within the memory cell array, and a second overdrive current flows into the second cell, the second overdrive current having a second height and a second width,
wherein a distance between the first cell and the D/A conversion circuit is less than a distance between the second cell and the D/A conversion circuit, and
wherein the first height of the first overdrive current is smaller than the second height of the second overdrive current, and the first width of the first overdrive current is greater than the second width of the second overdrive current.

13. The system of claim 12, wherein an amount of charges generated by the first overdrive current flowing into the first cell is substantially equal to that of charges generated by the second overdrive current flowing into second the cell.

14. The system of claim 11, wherein the charging voltage at the terminal of the height adjusting capacitor is controlled to adjust the height of the overdrive current.

15. The system of claim 11, wherein a turn-on time of the short pulse signal output from the short pulse generator is controlled to adjust the width of the overdrive current.

16. The system of claim 10, wherein the calibration controller performs a search algorithm and, when, in the search algorithm, a search point has moved in a direction to maintain the width of the overdrive current and has not crossed an overdrive current curve, the calibration controller controls the search point to move in the direction.

17. The system of claim 10, wherein the calibration controller performs a search algorithm and, when, in the search algorithm, a search point has moved in a first direction to maintain the width of the overdrive current and has not crossed an overdrive current curve, the calibration controller controls the search point to move in a second direction to reduce the width of the overdrive current.

18. The system of claim 10, wherein the cell voltage detection circuit comprises:
- a cell current detector configured to output the cell voltage;
- first and second voltage samplers configured to sample the cell voltage after the cell voltage becomes stabilized, the first and second voltage samplers storing first and second sampled voltages in first and second capacitors, respectively;
- first and second amplifiers configured to amplify voltages output from the first and second voltage samplers into first and second reference voltages, respectively; and
- first and second comparators configured to compare the cell voltage before the cell voltage becomes stabilized to the first and second reference voltages, respectively.

19. A driver for a semiconductor memory, the driver comprising:
- a digital/analog (D/A) conversion circuit configured to output a spike current that includes a target current and an overdrive current, the overdrive current having a height and a width;
- a memory cell array including a cell into which the spike current flows to write data in the cell; and
- a spike current control circuit configured to receive height adjusting data and width adjusting data and control the height and width of the overdrive current,
wherein the spike current control circuit includes:
- a D/A converter configured to convert the height adjusting data into an analog current;
- a height adjusting capacitor configured to receive the analog current and be charged to a charging voltage, a level of the charging voltage being determined based on the height of the overdrive current;
- a short pulse generator configured to generate a short pulse signal based on the width adjusting data, a turn-on time of the short pulse signal being determined based on the width of the overdrive current; and
- a width adjusting switch configured to couple the height adjusting capacitor to a gate terminal of a dropping voltage transmission switch in response to the short pulse signal.

20. The driver of claim 19, wherein the height of the overdrive current is proportional to a distance between the cell and the D/A conversion circuit, and the width of the short pulse signal is inversely proportional to the distance between the cell and the D/A conversion circuit.

\* \* \* \* \*